United States Patent [19]
Strain et al.

[11] Patent Number: 5,517,453
[45] Date of Patent: May 14, 1996

[54] MEMORY WITH MULTIPLE ERASE MODES

[75] Inventors: Robert J. Strain, San Jose; Martin H. Manley, Saratoga, both of Calif.

[73] Assignee: National Semiconductor Corporation, Santa Clara, Calif.

[21] Appl. No.: 306,454

[22] Filed: Sep. 15, 1994

[51] Int. Cl.$^6$ ........................................ G11C 7/00
[52] U.S. Cl. .................. 365/185.12; 365/185.27; 365/195; 365/185.18; 365/185.33; 365/236; 365/238.5
[58] Field of Search ..................... 365/218, 200, 365/189.01, 230.01, 230.03, 900, 218, 238.5, 189.02

[56] References Cited

U.S. PATENT DOCUMENTS

| | | | |
|---|---|---|---|
| 4,698,750 | 10/1987 | Wilkie et al. | 364/200 |
| 5,212,663 | 5/1993 | Leong | 365/218 |
| 5,341,339 | 8/1994 | Wells | 365/218 |
| 5,357,475 | 10/1994 | Hasbun et al. | 365/218 |
| 5,369,616 | 11/1994 | Wells et al. | 365/218 |
| 5,371,702 | 12/1994 | Nakai et al. | 365/218 |

*Primary Examiner*—Viet Q. Nguyen
*Attorney, Agent, or Firm*—Skjerven, Morrill, MacPherson, Franklin and Friel; Paul L. Winters; William L. Paradice, III

[57] ABSTRACT

An electrically-erasable, electrically programmable read-only memory (EEPROM) with multiple erase modes identifies sections of memory cells that have not received a write operation subsequent to the most recent erase operation and inhibits erasure of the memory cells in such sections. An indicator column is formed from indicator memory cells added to each section. During a write operation in which a section is first erased and then programmed, the EEPROM reads the indicator memory cell added to the section and inhibits the erase of the section if the memory cells in the section are in an erased state.

17 Claims, 10 Drawing Sheets

| OP'N | GATE (SEL'D ROW) | GATE (NON-SEL'D ROW) | DRAIN | SOURCE | P-WELL | N-WELL |
|---|---|---|---|---|---|---|
| NOP | 0 | 0 | $V_{CC}/2$ | HI-Z | 0 | $V_{CC}$ |
| ERASE | 0 | $V_{PP}$ | HI+ | HI+ | HI+ | HI+ |
| WRITE 1 | $V_{PP}$ | 0 | $V_{PP}/2$ | 0 | 0 | $V_{CC}$ |
| WRITE 0 | $V_{PP}$ | 0 | 0 | 0 | 0 | $V_{CC}$ |
| READ | $V_{CC}$ | 0 | $V_{CC}/2$ | HI-Z | 0 | $V_{CC}$ |

| E, BLOCK ERASE CMD | 1 | X | 1 | 1 | 1 | 1 | 1 |
|---|---|---|---|---|---|---|---|
| W, WRITE CMD | 1 | 1 | 1 | 1 | 1 | 0 | 1 |
| IB, INDICATOR BIT | X | X | 0 | NA | 1 | NA | NA |
| ERASE TIMER | 1 | 0 | NA | NA | 1 | 0 | 0 |
| WRITE TIMER | NA | NA | 0 | 1 | 0 | 0 | 1 |
| COLUMN DRIVE | HI+ | 0 | 0 | 0 | HI+ | 0 | 0 |
| LATCH ENABLE | 0 | 0 | 1 | 0 | 1 | 1 | 0 |
| SENSE CONTROL | 1 | 1 | 1 | 0 | 1 | 1 | 0 |
| ROW $V_D$ | $V_{CC}$ | $V_{CC}$ | $V_{CC}$ | $V_{PP}$ | $V_{CC}$ | $V_{CC}$ | $V_{PP}$ |
| BLOCK ERASE | 1 | 0 | 0 | 0 | 0 | 0 | 0 |

MEMORY WITH MULTIPLE ERASE MODES

BACKGROUND OF THE INVENTION

1. Field of the Invention

The present invention relates to electrically-erasable, electrically programmable read-only memories (EEPROMs) and Flash EEPROMS, and more particularly, but not by way of limitation, to an EEPROM and a Flash EEPROM that incorporate multiple erase modes to facilitate more efficient write operations.

2. Discussion of the Prior Art

EEPROMs and Flash EEPROMs commonly contain an array of rows and columns of semiconductor field effect transistors incorporating floating gate structures. Each intersection of a row and a column in the array is designated as a memory cell and can be programmed to indefinitely store a logic value ("0" or "1"). The memory cell is programmed by applying the proper voltages to the memory cell source, drain, control gate, and other signal lines, resulting in electrically charging the floating gate. Depending on the construction of the memory cells, the other signal lines may provide access to a memory cell erase gate, a well region, or substrate Once programmed, the memory cell charged floating gate inhibits current flow when the memory cell is activated as part of a read operation. This allows sensing and decoding circuitry to identify the logic state of the memory cell.

A memory cell is erased by applying the proper voltages to the source, drain, control gate, and other signal lines, resulting in depletion of the charge on the floating gate and a return of the memory cell to an unprogrammed state.

A conventional EEPROM generally allows simultaneous erase of one or multiple bytes of cells (8, 16, 32, etc.). A Flash EEPROM, which is a particular type of EEPROM, allows simultaneous erase of sectors of cells. A sector generally consists of one or more rows of the Flash EEPROM memory array. For the purpose of this patent, a "section" will be referred to as a set of memory cells grouped so as to be erased simultaneously, whether in a conventional EEPROM or a Flash EEPROM. For a conventional EEPROM, a section is a byte or multiple bytes of cells, depending on the configuration of the device. For a Flash EEPROM, a section is a sector, which could be a single row, multiple rows, or portions of a row, depending on the configuration of the Flash EEPROM. In addition, for the purposes of this patent, the term EEPROM will generally refer to both conventional, byte erasable EEPROMs and Flash EEPROMs.

It is generally desirable that an EEPROM memory cell be in an erased state prior to programming. Common EEPROM write operations, during which selected memory cells in the array are programmed, first erase the selected memory cells and then write data to the memory cells.

For a conventional EEPROM, the time required to erase memory cells is commonly about 5–10 ms and the time required to write data to memory cells is commonly about 5–10 ms. Thus, the time required to perform a conventional EEPROM write operation is commonly about 10–20 ms. For some classes of Flash EEPROMs that use hot electron programming, the time required to write data to a memory cell is commonly about 10–50 μs, whereas, the time required to erase a memory cell is about 100–500 ms. For both conventional EEPROMs and Flash EEPROMs, erasure of unprogrammed memory cells prior to writing data to the cells is an unnecessary, time-consuming operation.

The time required to perform a write operation can be significantly reduced if the unprogrammed memory cells are not erased before writing. There is a need, therefore, for an EEPROM that can significantly reduce the time required to perform a write operation by identifying the programmed status of the memory cells in a selected section and inhibiting an unnecessary erase operation if the memory cells in the selected section have not been programmed since the last erasure of the memory cells in the section.

SUMMARY OF THE INVENTION

The present invention provides an EEPROM that inhibits the erasure of a selected section when a write command is issued, if no memory cells in the selected section have been programmed since the last erasure of the selected section. Indicator memory cells are provided that indicate whether any cells in the selected section have been programmed since the most recent erase operation on the selected section. Writing data to memory cells in the selected section, consisting of programming cells in the selected section, also results in the programming of the indicator cell for the selected section.

During a write operation, the indicator cell for the selected section is read to determine a programmed status of the selected section. If data has not been written to the selected section since the most recent erasure of the selected section, erasure of the cells in the selected section is unnecessary. When the selected section is in an unprogrammed state, the EEPROM inhibits the erasure of the selected section and proceeds with programming the cells in the selected section.

An object of the present invention is to provide a memory in which the time required to perform a write operation on a selected section of memory cells is decreased when the selected section of memory cells is determined to be in an unprogrammed state.

Another object of the present invention, to aid in achieving the above stated object, is to provide an indication of the programmed status of each section in the memory array.

Still another object of the present invention, while achieving the above stated objects, is to inhibit the erasure of a selected section if the selected section is in an unprogrammed state before data is written to the selected section.

Other objects, advantages, and features of the present invention will be apparent to those skilled in the art from the following detailed description, when read in conjunction with the drawings and the appended claims.

DESCRIPTION

Figure 1:
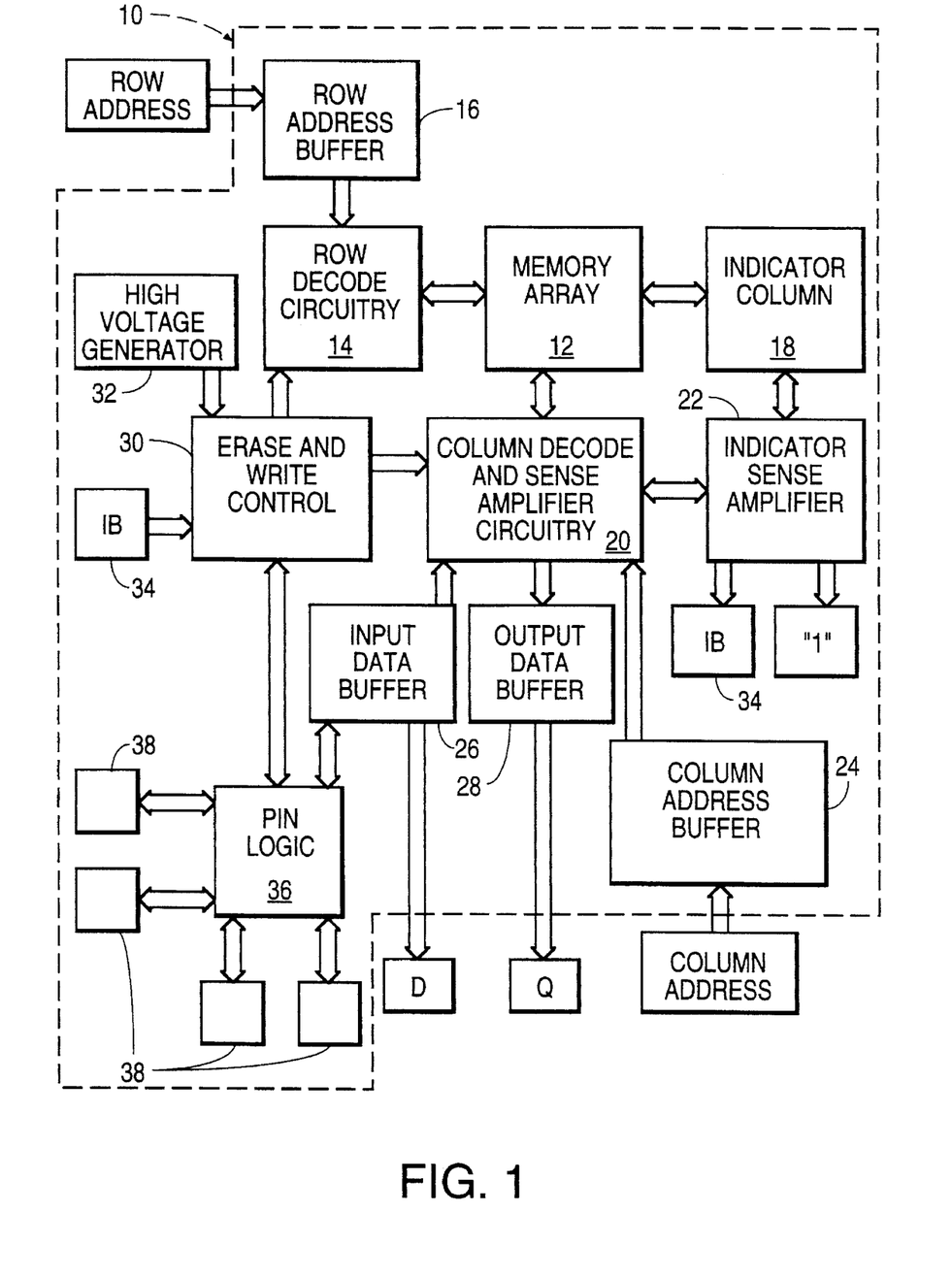
FIG. 1 is an illustrative block diagram of the architecture of the present invention.

Referring now to the drawings in general, and more particularly to FIG. 1, shown therein is the block architecture for a Flash EEPROM 10 constructed in accordance with the present invention. The Flash EEPROM 10 is formed with well known components with the exception of those described herein. The Flash EEPROM 10 can perform a bulk erase, in which all the memory cells are erased, or a section erase, in which a section of memory cells is erased. For the purpose of this description, a section consists of a single row of memory cells so that all the memory cells are erased simultaneously during a section erase. Additional embodiments of the invention will later be described for a Flash EEPROM wherein a section consists of multiple rows and a byte-selectable EEPROM wherein a section consists of a byte of memory cells.

The EEPROM 10 has a memory array 12 which is made of memory cells (not shown) arranged into rows and columns. A row is a horizontal group of memory cells extending the full length of the memory array. A column is a vertical group of memory cells extending the full width of the memory array. A memory cell can be written, erased, or read by the appropriate combinations of row and column voltages.

Row decode circuitry 14 selects rows of memory cells for reading, writing and erasing. The row decode circuitry 14 is also capable of selecting all rows for bulk erase. A row address buffer 16 receives and stores row address information and delivers this information to the row decode circuitry 14.

An indicator memory cell (not shown) is added for each row of memory cells in the memory array 12. The indicator memory cells added to each row from an indicator column 18. The row decode circuitry 14 can access the indicator memory cells to perform, read, write, and erase operations.

Column decode and sense circuitry 20 is connected to the columns of memory cells in the memory array 12. The column sense and decode circuitry 20 generally consists of a column decoder (not shown) and a plurality of addressable sense amplifiers (not shown). The column sense and decode circuitry 20 is capable of impressing the voltage necessary to erase and program cells in a selected column. The column sense and decoding circuitry 20 is also capable of reading a memory cell by sensing the current at the memory cell when the appropriate read voltages are applied to the cell. The column sense and decode circuitry 20 will normally have a latching capability. An indicator column sense amplifier 22, similar to the sense amplifier in the column decode and sense circuitry 20, is connected to the indicator column 18. The output from the indicator column sense amplifier 22 is designated as data output "IB" 34, for "indicator bit," and represents the write status of a selected indicator column bit.

The column decode and sense circuitry 20 selects the appropriate memory column, based on address input information provided from a column address buffer 24. During a write mode, the sense amplifier portion of the column decode and sense circuitry 20 latches the input data provided by a input data buffer 26. During a read mode, the sense amplifier portion of the column decode and sense circuitry 20 reads the contents of the memory cells and provides this data to a output data buffer 28. The output data buffer 28 generally assumes a high impedance state when the EEPROM 10 is not in a mode to deliver data.

Erase and write control logic 30 activates the row decode circuitry 14 to select either one row for write or erase or to select all rows for erase. The erase and write control logic 30 supplies timed, high voltage pulses to rows and columns. High voltage generator circuitry 32 provides the necessary high voltages for write and erase operations. Data output "IB" 34, from the indicator column sense amplifier 22, is an input to the erase and write control logic 30.

Pin logic 36 uses externally applied signals (both levels and transitions) from external pins 38 to generate internal control signals necessary to perform internal read, write, and erase operations.

There are a variety of architectures available for both conventional and Flash EEPROM memory cells. The various architectures of memory cells use different electrical connections and applied voltages to program and erase the memory cells. For example, one architecture of memory cells employs an erase gate to program and erase such memory cell. Another architecture of memory cells employs well drivers to program and erase each memory cell. This invention does not depend on the use of a specific architecture of memory cell. The invention does, however, incorporate the necessary connections to program and erase the memory cells used in the memory array.

Figure 2:
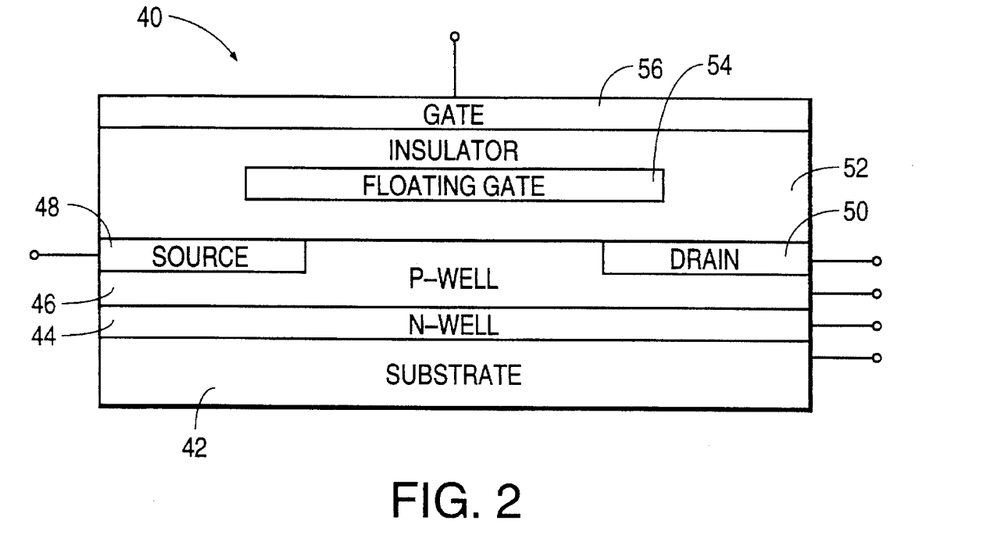
FIG. 2 is a cross-sectional representation of an EEPROM memory cell with a single control gate.

Referring now to FIG. 2, shown therein is a cross-sectional representation of one type of EEPROM memory cell 40 that employs well drivers to program and erase the memory cell 40. A substrate 42 is formed of lightly doped, p-type material. An n-well 44 of n-type material is formed on the substrate 42, and a p-well 46 of lightly doped, p-type material is formed on the n-well 44. A source region 48 and a drain region 50 of heavily doped n-type material are formed in the p-well 46. An insulator layer 52, commonly an insulating oxide, is formed on the p-well 46, source region 48, and drain region 50. A floating gate 54 is formed such that the floating gate 54 is buried in the insulator layer 52. A control gate 56 is formed on the insulator layer 52 and extends across the surface of the insulator layer 52.

Figure 3:
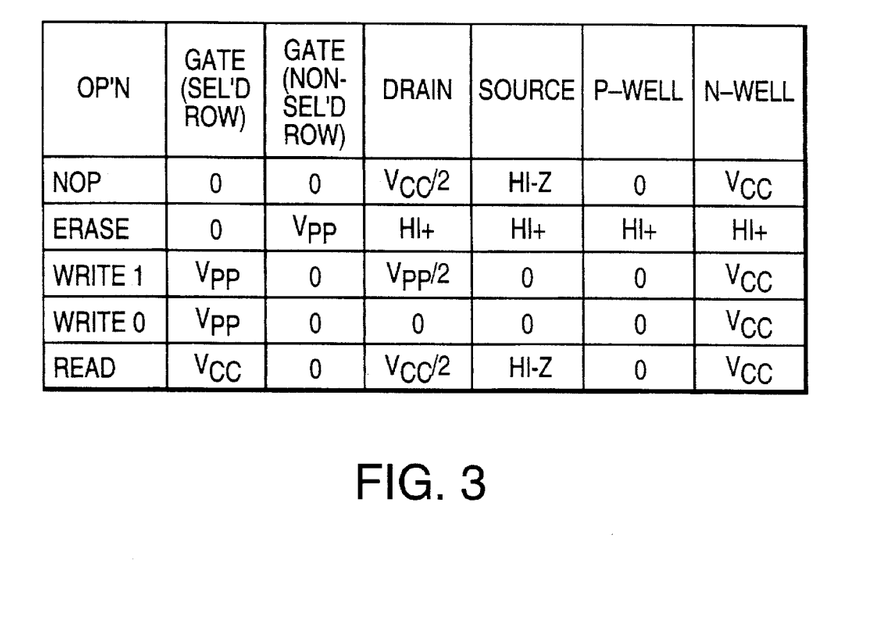
FIG. 3 is a table showing the appropriate voltages to erase, write, and read the memory cell of FIG. 2.

During programming, appropriate voltages are applied to charge the floating gate 54 by way, or example, of hot electron injection. During erasing, the appropriate voltages are applied to discharge the floating gate 54 by way, for example, of Fowler-Nordheim tunneling to the source region 48, p-well 46, or drain region 50. FIG. 3 shows the appropriate voltages to erase, write, and read the memory cell 40 in FIG. 2. For reference, $V_{pp}$ is commonly about +12 to +18 V. $V_{cc}$ is commonly about +5 V. Hi-Z denotes a high impedance. This cell and its operating characteristics represent one example of an EEPROM cell that can be used in conjunction with this invention.

Figure 4:
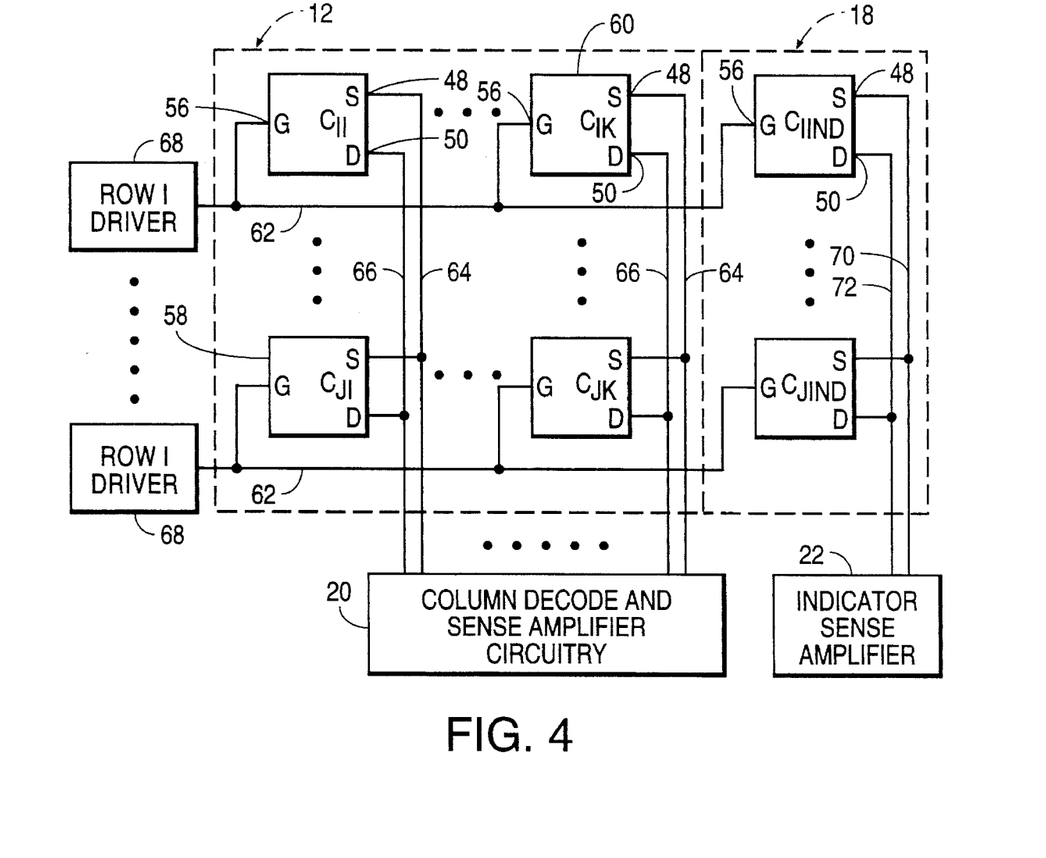
FIG. 4 is a block diagram of a portion of the memory cell array, showing the connection of an indicator column of memory cells.

Referring to FIG. 4, the electrically-erasable, electrically-programmable read-only memory array 12 is formed by arranging semiconductor field effect transistor memory cells 40 in rows 58 and columns 60. The control gates 56 of memory cells 40 along each row 58 are connected to a common row line 62. The source regions 48 of all memory cells 40 in each column 60 of memory cells 40 are connected to a common source line 64. The drain regions 50 of all memory cells 40 in each column 60 of memory cells 40 are connected to a common drain line 66.

Each row line 62 in the memory array 12 is connected to a row driver 68. The row driver 68 responds to read, write, and erase commands and row address information to output the appropriate voltages on the row lines 62 to perform the required operation. The plurality of the row drivers 68 are part of the row decode circuitry 14.

The indicator column 18 of memory cells 40 is formed by adding an additional memory cell 40 to each row 58 of memory cells 40 in the memory array 12. The control gate 56 of each memory cell 40 in the indicator column 18 is connected to the corresponding row line 62. The source region 48 for each memory cell 40 in the indicator column 18 is connected to a common source line 70 for the indicator column 18. The drain region 50 for each memory cell 40 in the indicator column 18 is connected to a common drain line 72 for the indicator column 18.

The source line 64 and drain line 66 in each memory cell 40 in the memory array 12 are connected to the column decode and sense amplifier circuitry 20. The column decode and sense amplifier circuitry 20 responds to read, write and erase commands and column address information to provide the appropriate voltages on the column lines to perform the required operation.

The source line 70 and drain line 72 for the indicator column 18 are connected to the indicator column sense amplifier 22, which operates in a similar manner as the column decode and sense amplifier circuitry 20.

Figure 5:
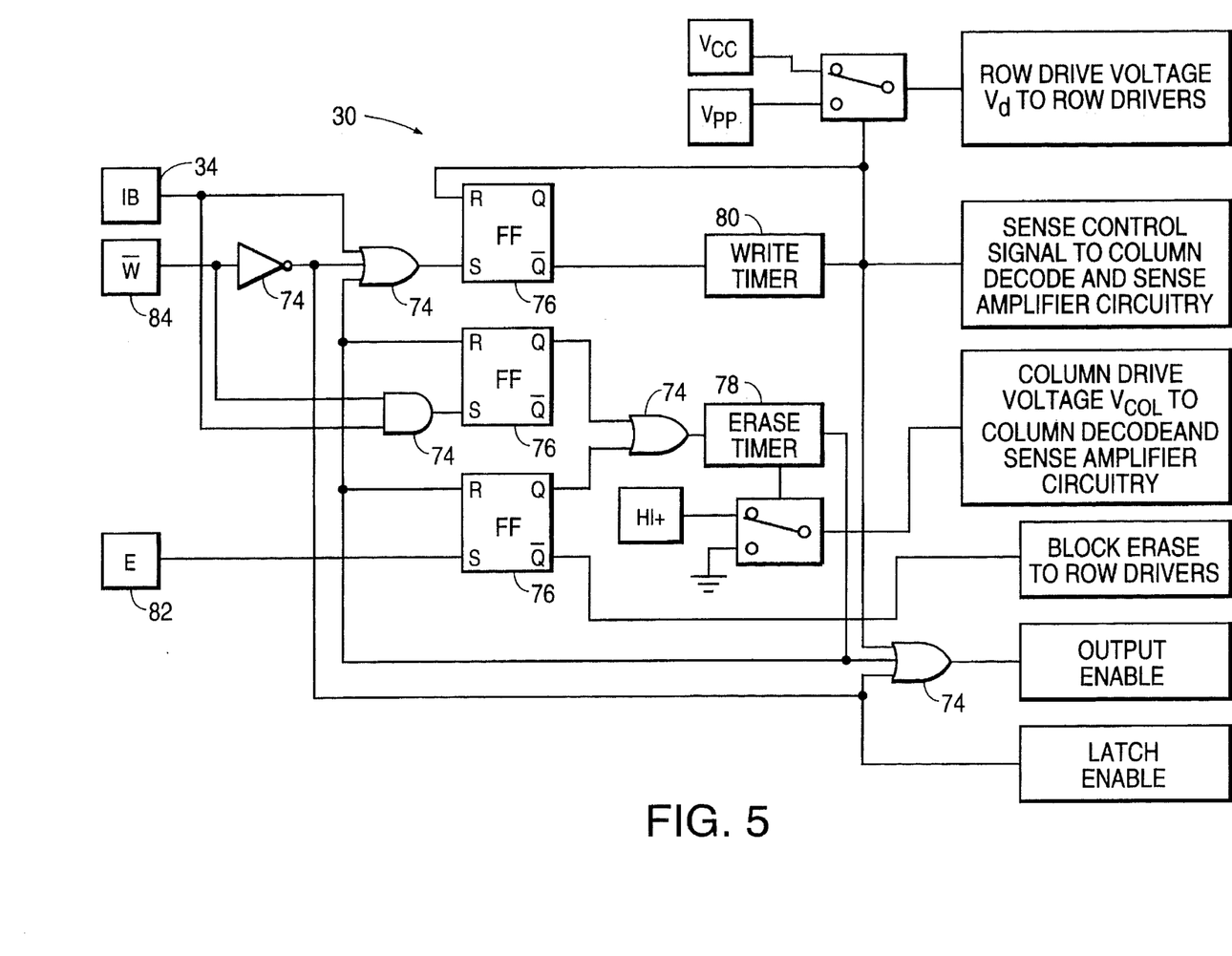
FIG. 5 is a schematic block diagram for erase and write control circuitry that inhibits an erase option on a selected row of memory cells if a signal from the indicator column sense amplifier indicates the selected row of memory cells is unprogrammed.

FIG. 5 shows a schematic block diagram of the erase and write control logic 30 that responds to erase and write commands and outputs the required signals to perform the required operations.

The erase and write control logic 30 has logic gates 74, RS flip-flops 76, an erase timer 78, and write timer 80. The high voltages $V_{pp}$ and Hi+ are commonly supplied by the high voltage generator circuitry 32, as shown in FIG. 1.

A bulk, or full array erase command "E" 82 results in a block erase command to the row decode circuitry 14 to select all the rows 58 for erasure. The erase and write control logic 30 also delivers the necessary high voltage, timed pulses to the row drivers 68, and the column decode and sense amplifier circuitry 20 and the indicator column sense amplifier 22. The output data buffer 30 is disabled during the erase operation. The table in FIG. 3 shows common voltage levels applied to the memory cells 40 for this operation.

To write data to a selected row 58 in the memory array 12, signals are impressed on the external control pins 38, addressing data is loaded in the column address buffer 24 and row address buffer 16, and data is loaded in the input data buffer 26. The indicator column sense amplifier 22 provides the signal "IB" 34 to the erase and write control logic 30. Pin logic 36 provides a write signal, "W" 84 to the erase and write control logic 30. If "IB" 34 is a logic "1", the erase timer 78 is activated and the selected row 58 is erased. Once the erasure of the selected row 58 is completed., the write timer 80 is activated and the data is written to the selected row 58.

Figure 6:
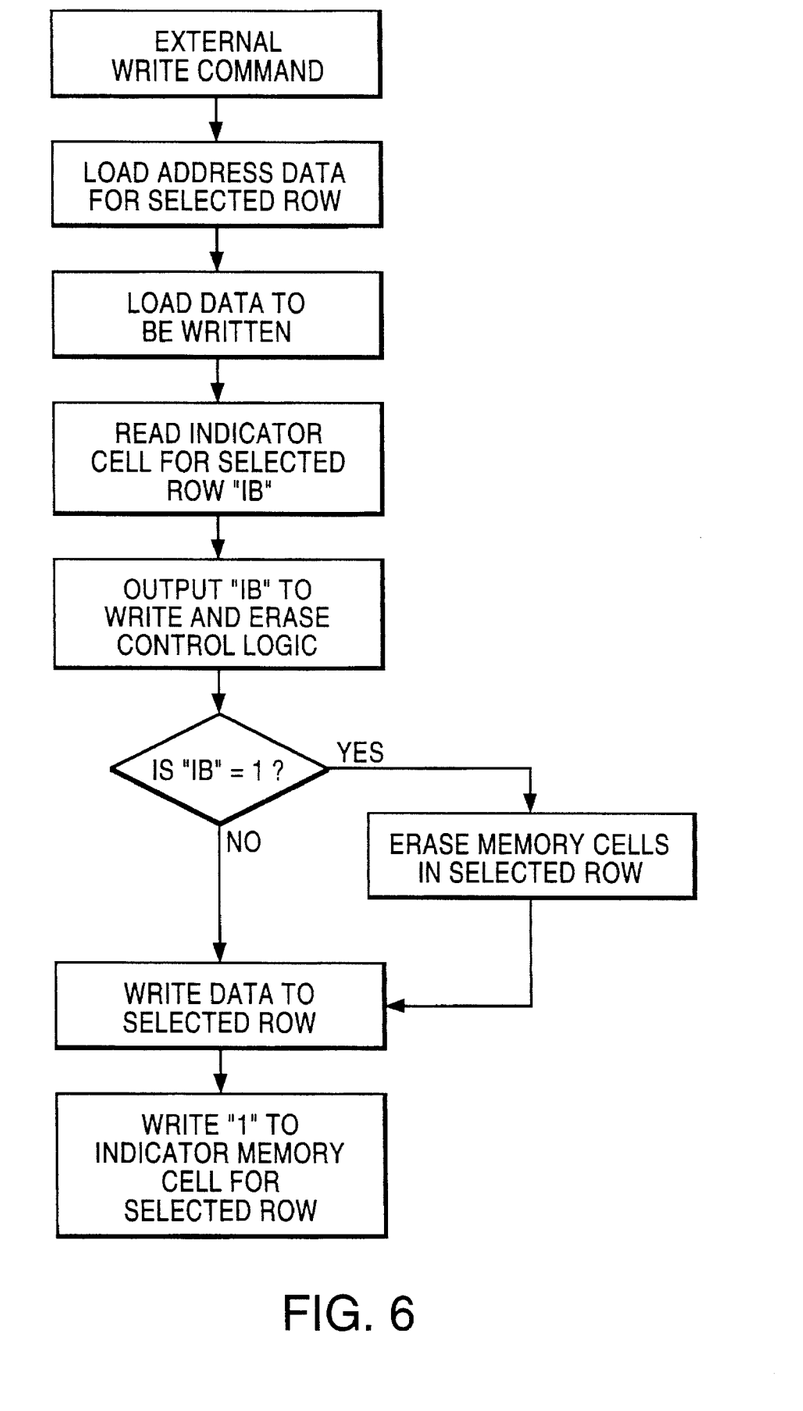
FIG. 6 is a general flowchart for the sequence of steps performed by the EEPROM in conjunction with the circuitry of FIG. 5.

FIG. 6 provides a general flow chart of the basic steps in this sequence. It shows the basic if-then logical relationship of the IB 34 value to the inhibiting function of the erase command prior to an issued write command. If the IB 34 output is a logical "0", then the erase command prior to the issued write command is inhibited.

Figure 7:
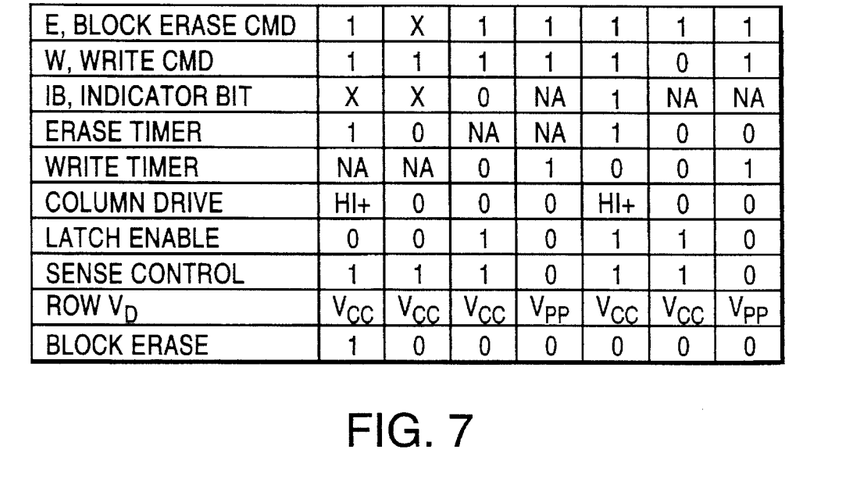
FIG. 7 shows a table of general voltage levels and transitions for various operation of the write and erase control logic of FIG. 5.

FIG. 7 provides a table of general voltage levels and transitions for the various operations of the erase and write control logic 30. For reference, $V_{pp}$ is commonly about +12 to +18 V. $V_{cc}$ is commonly about +5 V. Hi+ denotes high impedance. $V_d$ is the voltage applied to the row line 62 and is commonly $V_{cc}$, $V_{pp}$, or ground.

Figure 8:
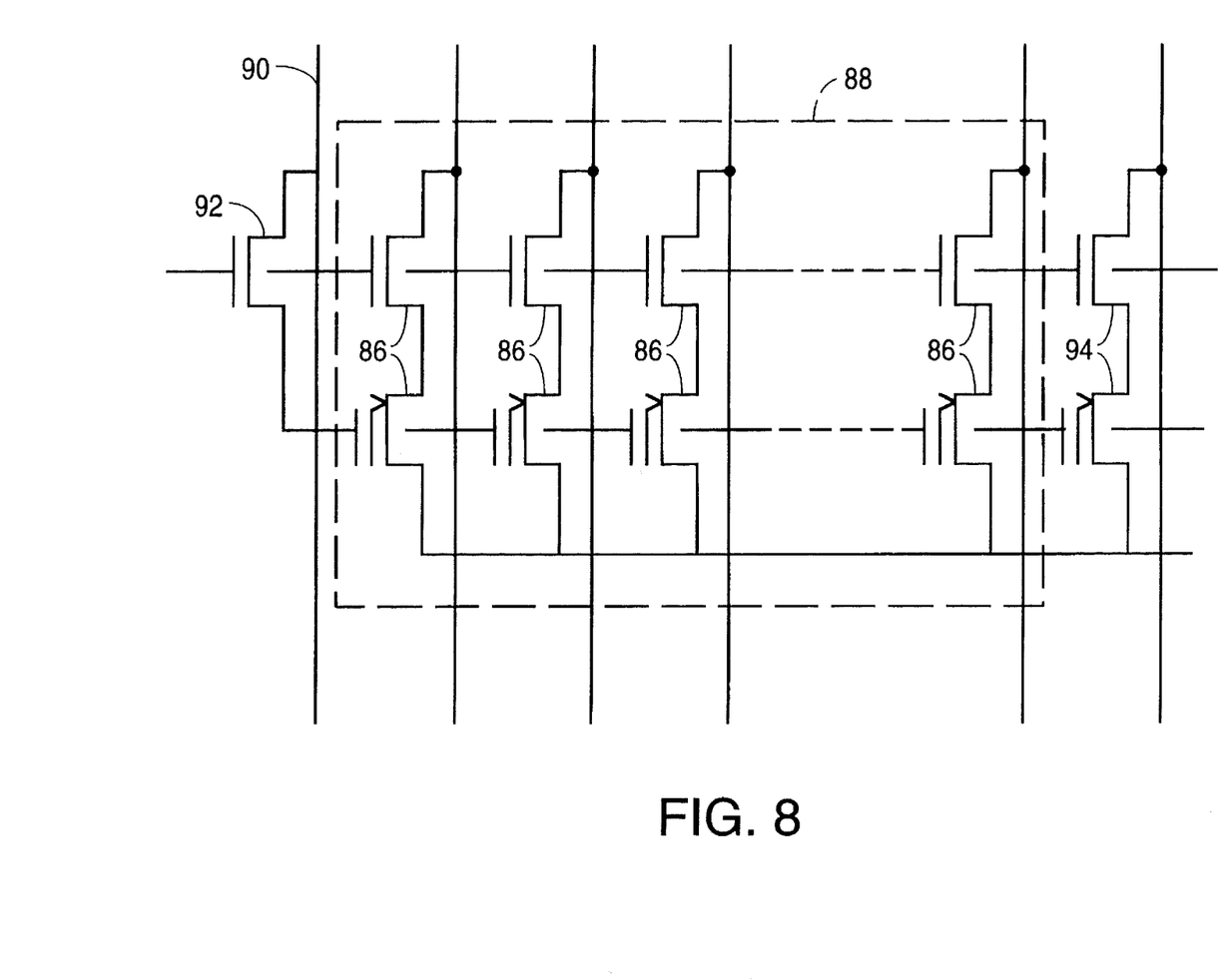
FIG. 8 is a general schematic representation of an array layout for a conventional, byte-erasable EEPROM of the present invention.

The above described invention can be modified as follows to allow for either byte-erase or allow for sections consisting of multiple rows. Referring to FIG. 8, shown therein is an array layout suitable for incorporation in a byte-erasable EEPROM memory with FLOTOX memory cells. In this type of memory, the cells 86 representing one byte 88 are arranged adjacently, and a separate byte select column line 90 is used to identify which byte within a row is to be selected for either write or erase operation, by way of a byte select transistor 92. As required, the grouping of cells may represent one byte or multiple bytes.

Figure 9:
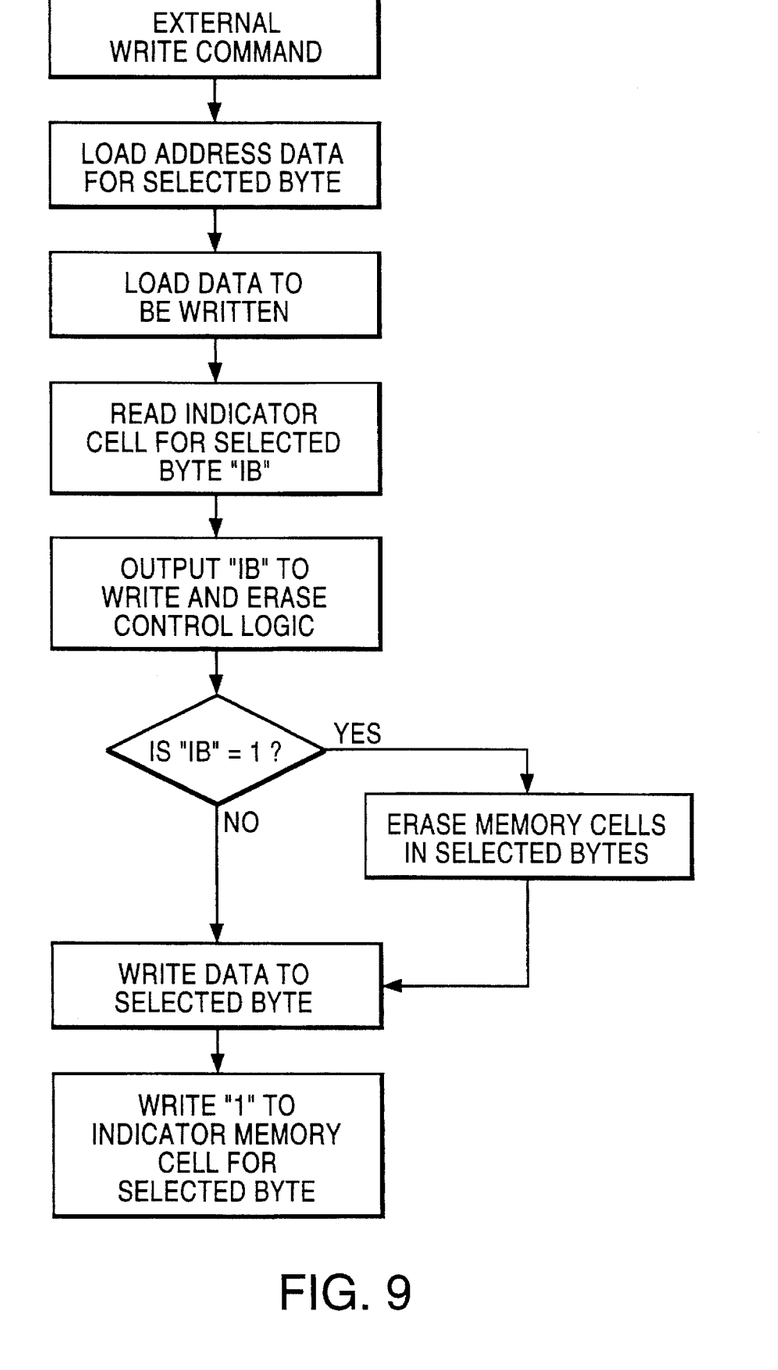
FIG. 9 is a general flowchart for the sequence of steps performed by the EEPROM described in FIG. 8.

According to the invention, one extra indicator memory cell 94 will be included for each byte grouping as shown. The indicator cell 94 will be written and read as described in the previous description in order to allow the byte erase operation to be omitted if no cells in the selected byte have been written since the last erase operation. FIG. 9 shows the general steps of this sequence for an EEPROM with byte-erase capability.

In the case of a Flash EEPROM memory in which the erase section consists of multiple rows, the array configuration shown in FIG. 1 and FIG. 4 is still applicable. As described previously, the erase control logic will ensure that all of the rows representing a give section will be driven to a low logic level during the erase cycle, while all other rows are held at $V_{pp}$. All of the rows in the section will therefore be erased simultaneously. Each row will still have one indicator cell, and all of the indicator cells within one section will be driven to a low state during the erase cycle.

Figure 10:
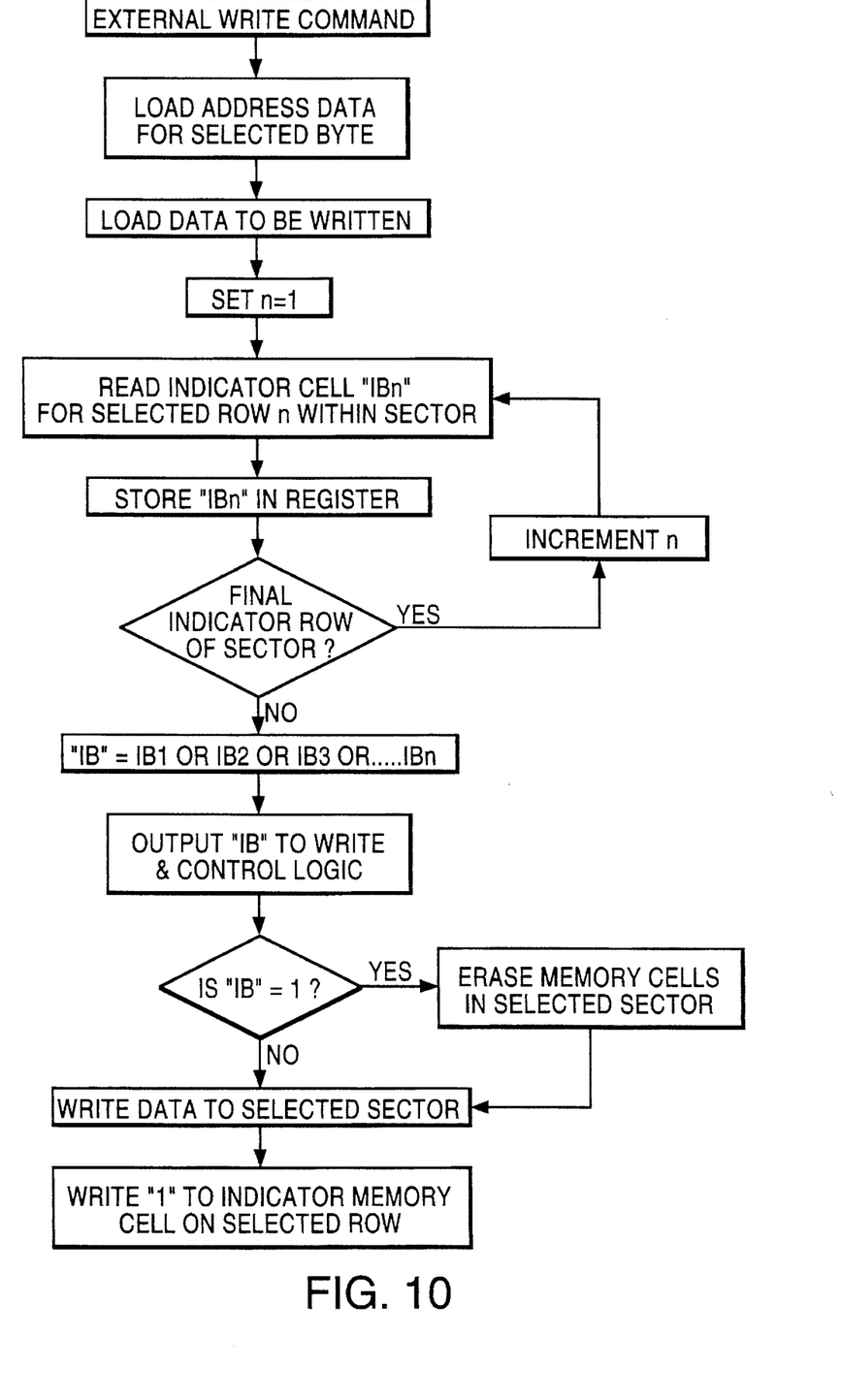
FIG. 10 is a general flowchart for the sequence of steps performed by a Flash EEPROM in which a section has multiple rows of memory cells.

If any row within the sector is now selected for a write operation, the indicator cell on that row will be programmed to a high level, as described previously. The indicator cells for the other rows within the section will remain at a low level. When data is to be written to this section, the erase and write control logic 32 will cause a sequential read operation of the indicator bits on all of the rows within the sector, temporarily storing each of these data bits in a register (not shown). A logical "OR" of the stored indicator cell bits will then be performed, to determine if any of the indicator bits has been set to a high level. The output of this OR function is equivalent to the output "IB" 34 described previously; if "IB" 34 is a logic 1, the section is identified as having been written since the last erase cycle, and so an erase cycle will be initiated prior to writing the new data. If "IB" 34 is a logic 0, there have been no write operations performed on the section since the last erase, and so the erase operation can be omitted. FIG. 10 shows the general steps for this sequence for a Flash EEPROM in which a section has multiple rows of memory cells.

Figure 11:
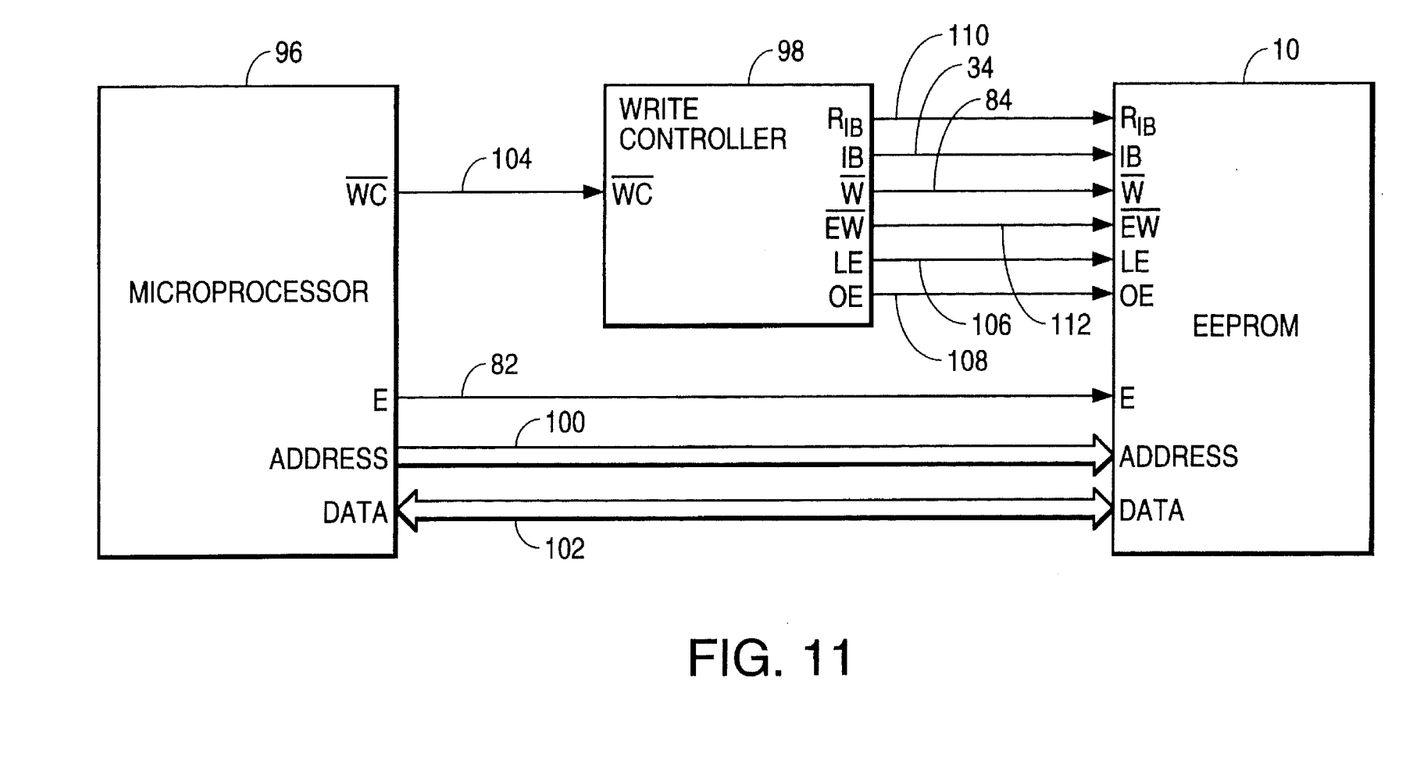
FIG. 11 is an illustrative block diagram showing the present invention in a microprocessor based application with external write control circuitry.
Figure 12:
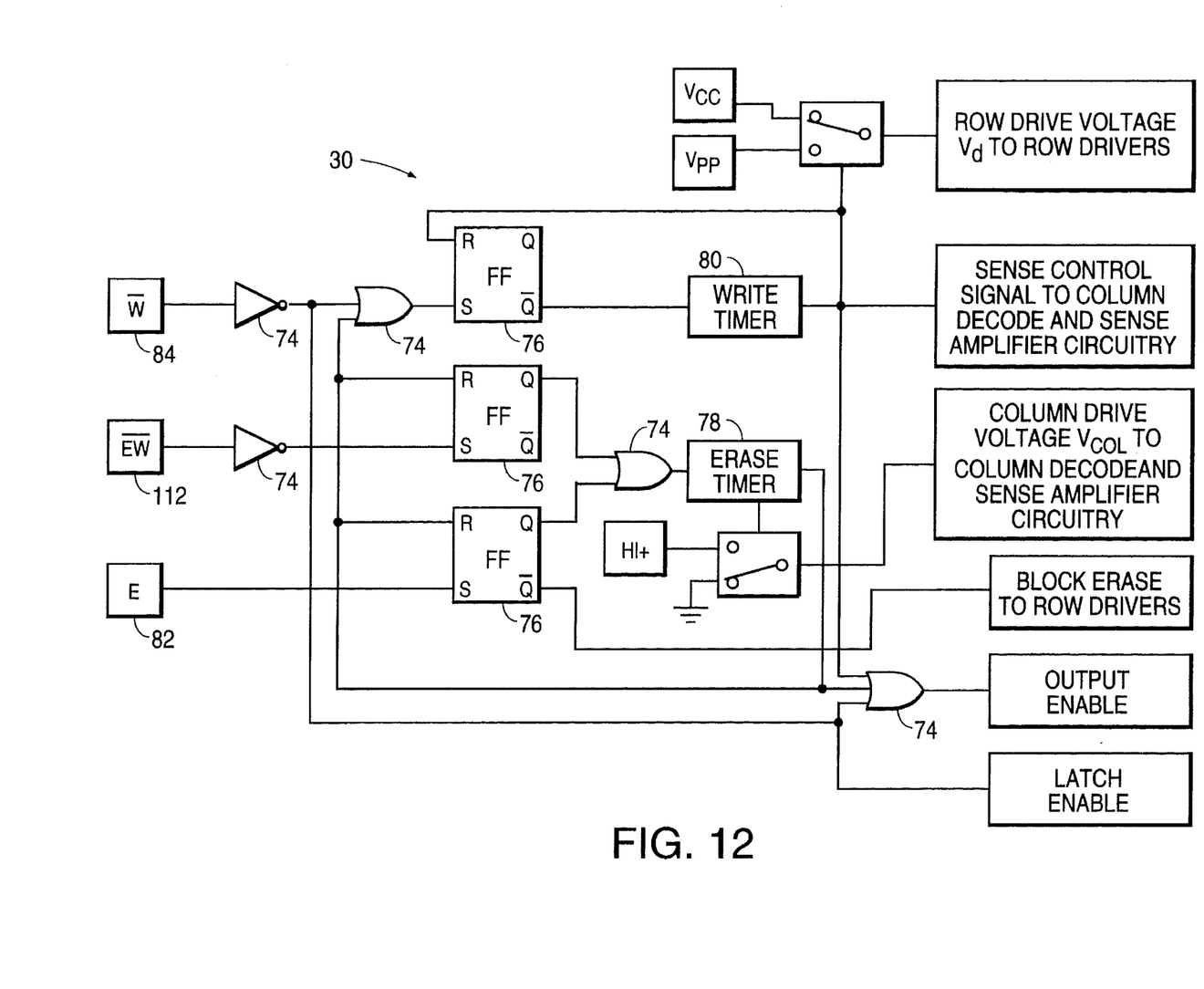
FIG. 12 is a schematic block diagram for write and erase control logic that would inhibit an erase of a selected row of unprogrammed memory cells in conjunction with external write control circuitry.

The present invention does not require circuitry necessary to inhibit an unnecessary erase operation be integrated into the erase and write control logic 30. The erase command inhibit control circuitry could be a separate circuit or a circuit external to the EEPROM 10. FIG. 11 shows a functional block diagram of the EEPROM 10 in a microprocessor based application with an external microprocessor 96 and external write controller 98. The write controller 98 is circuitry external to the EEPROM 10 necessary to inhibit an unnecessary row 58 erase operation. FIG. 12 shows a schematic block diagram for erase and write control logic 30 that could accommodate the external write controller 98, as shown in FIG. 11.

To perform a full array, or block erase, the microprocessor 96 issues the block erase command "E" 82. This command is issued to the EEPROM 10 external pins 38. The appropriate inputs are provided to the row decode circuitry 14, column decode and sense amplifiers 20, and the indicator column sense amplifier 22, to erase all memory cells 40 in the memory array 12 and the memory cells 40 in the indicator column 18 of the rows selected for erasure. The table in FIG. 3 shows a common voltage levels for this operation.

To write data to a row 58 in the memory array 12, the microprocessor 96 places the memory address on an address bus 100 and the data to be written on a data bus 102. The microprocessor 96 issues a write command "WC" 104 to the write controller 98. The write controller 98 issues the appropriate latch enable "LE" command 106 and output enable "OE" command 108 to latch the address and data and to disable the output during the writing operation. The write controller 98 issues a read indicator bit "RIB" command 110. This command cause the EEPROM 10 to read the indicator cell for the selected row 58 in the memory array 12 and report the value of the corresponding indicator memory cell as indicator bit "IB" 34.

In response to the logic level of "IB" 34, the write controller 98 issues either a write signal "$\overline{W}$" 84 or an erase and write "$\overline{EW}$" command 112. If "IB" 34 is a logical "1", this means that the selected row has been written to since the last erase operation on the selected row and the selected row must be erased before the data can be written. The "$\overline{EW}$" command 112 causes the EEPROM 10 to first erase the selected row and then write the data to the selected row. If "IB" 34 is a logical "0", this means that the selected row has not been written to since the last erase operation on the selected row and the selected row need not be erased before the data can be written. The "$\overline{W}$" command 84 inhibits the erase command and causes the data to be written to the selected row.

From the above description it is clear that the present invention is well adapted to carry out the objects and to attain the ends and advantages mentioned herein as well as those inherent in the invention. While presently preferred embodiments of the invention have been described for purposes of this disclosure, it will be understood that numerous changes may be made which will readily suggest themselves to those skilled in the art and which are accomplished within the spirit of the invention disclosed and as defined in the appended claims.

What is claimed is:

1. An electrically erasable, electrically programmable read-only memory (EEPROM) having an array of memory cells organized as a plurality of sections of memory cells, the EEPROM capable of simultaneously erasing all the memory cells in the array or simultaneously erasing a selected section of memory cells, comprising:

indicating means, connected to the plurality of sections, for indicating that data has been written to a selected section of memory cells since the most recent erase of the selected section; and inhibiting means, connected to the indicating means and to the array, for inhibiting an erase of the selected section of memory cells prior to writing data to the selected section during the EEPROM write operation, when the indicating means indicates that no data has been written to the selected section since the most recent erase of the selected section.

2. The EEPROM of claim 1, wherein the indicating means comprises:

an indicator memory cell corresponding to each section of memory cells;

writing means for writing a bit to the indicator memory cell when the data is written to the corresponding section of memory cells; and reading means for reading the bit stored in the indicator memory cell corresponding to each section of memory cells.

3. The EEPROM of claim 2, wherein the inhibiting means comprises:

erase and write logic circuitry for sequentially erasing and writing the selected section of memory cells during a write operation;

logic means for bypassing the erasing of the selected section of memory cells by the erase and write logic circuitry during a write operation if the indicating means indicates no data has been written to the selected section of memory cells since the most recent erase of the selected section.

4. The EEPROM of claim 1, wherein each section of memory cells comprises a byte of memory cells.

5. The EEPROM of claim 1, wherein the array comprises a plurality of rows and columns of memory cells.

6. The EEPROM of claim 5, wherein each section of memory cells comprises a row of memory cells.

7. The EEPROM of claim 5, wherein each section of memory cells comprises a plurality of rows of memory cells.

8. The EEPROM of claim 5, wherein each section of memory cells comprises a portion of a row of memory cells.

9. An electrically erasable, electrically programmable read-only memory (EEPROM) having rows and columns of memory cells and having associated logic to read, write and erase the memory cells in response to erase commands, particularly to erase memory cells in two or more modes, of which one is a plurality of rows of the memory and another is a single row of memory cells, the EEPROM comprising:

indicating means, connected to the rows of memory cells, for indicating that data has been written to a selected row since the most recent erase of said selected row;

inhibiting means, connected to the indicating means, for inhibiting the erase of said selected row when the indicating means indicates no data has been written to said selected row since the most recent erase of said selected row.

10. The EEPROM of claim 9 wherein the indicating means comprises:

a plurality of indicator memory cells, connected to the rows, forming an indicator column of indicator memory cells;

write means, connected to the indicator column, for writing a bit to an indicator memory cell corresponding to said selected row in response to a write operation performed on said selected row;

read means, connected to the indicator column, for reading the bit written to the indicator memory cell corresponding to said selected row.

11. The EEPROM of claim 10, wherein the inhibiting means comprises:

status means, connected to the read means, for obtaining a logic signal from the read means indicative of the bit written to the indicator memory cell corresponding to said selected row, in response to a command to write data to said selected row;

erase means, connected to the status means, for erasing said selected row if the logic signal indicates data has been written to the selected row since the last erasure of the memory cells in said selected row; and erase inhibit means, connected to the status means, for inhibiting the erase of said selected row if the logic signal indicates no data has been written to said selected row since the last erasure of the memory cells in said selected row.

12. An electrically erasable, electrically programmable read-only memory (EEPROM) having an array of memory cells arranged in rows and columns and associated circuitry to read, write and erase the memory cells, the EEPROM comprising:

sections of memory cells, wherein each section comprises a group of memory cells organized such that the memory cells in each section can be erased simultaneously without erasing the memory cells in other sections;

an indicator column comprising a plurality of indicator memory cells, each indicator memory cell connected to a corresponding section, wherein each indicator memory cell provides a write status for the corresponding section, the write status indicating whether a write operation has been performed on a selected section since the most recent erase of the selected section;

a plurality of row drivers connected to the rows of memory cells;

column decode and sense amplifier circuitry connected to the columns of memory cells;

an indicator sense amplifier connected to the indicator column; and erase and write control circuitry, connected to the row drivers, the column decode and sense amplifier circuitry and the indicator sense amplifier, for providing signals during a write operation to erase the selected section and then write data to the selected section and a bit to the corresponding indicator memory cell when the write status indicates a write operation has been performed on the selected section of memory cells since the most recent erase of the section, and for providing signals during a write operation to inhibit the erase of a selected section of memory cells and then write the data to the selected section and the bit to the corresponding indicator memory cell when the write status indicates that no write operation has been performed on the selected section since the most recent erase of the selected section.

13. The EEPROM of claim 12, wherein the erase and write control circuitry comprises:

an erase timer, for providing a timed erase signal of sufficient duration to enable the row drivers and the column sense and decode circuitry to erase the memory cells in the selected section and to enable the row drivers and the indicator sense amplifier to erase the bit in the corresponding indicator memory cell;

a write timer, for providing a timed write signal of sufficient duration to enable the row drivers and the column sense and decode circuitry to write the data to the memory cells in the selected section and to enable the row drivers and the indicator sense amplifier to write the bit to the corresponding indicator memory cell; and erase timer inhibiting means, connected to the erase timer, for inhibiting the operation of the erase timer when the write status indicates that no write operation has been performed on the selected section since the most recent erase of the selected section.

14. The EEPROM of claim 12, wherein each section of memory cells comprises a byte of memory cells.

15. The EEPROM of claim 12, wherein each section of memory cells comprises a row of memory cells.

16. The EEPROM of claim 12, wherein each section of memory cells comprises a plurality of rows of memory cells.

17. The EEPROM of claim 12, wherein each section of memory cells comprises a portion of a row of memory cells.

* * * * *